United States Patent
Chen et al.

(10) Patent No.: US 8,052,833 B2
(45) Date of Patent: Nov. 8, 2011

(54) CHEMICAL TREATMENT APPARATUS

(75) Inventors: Chia Chun Chen, Taipei County (TW); Wen Cheng Yu, Yilan County (TW)

(73) Assignee: Inotera Memories, Inc., Taoyuan County (TW)

( * ) Notice: Subject to any disclaimer, the term of this patent is extended or adjusted under 35 U.S.C. 154(b) by 325 days.

(21) Appl. No.: 12/401,856

(22) Filed: Mar. 11, 2009

(65) Prior Publication Data

US 2010/0122771 A1  May 20, 2010

(30) Foreign Application Priority Data

Nov. 19, 2008 (TW) .............................. 97144656 A

(51) Int. Cl.
*C23C 16/00* (2006.01)
*H01L 21/00* (2006.01)

(52) U.S. Cl. .............................. 156/345.18; 156/345.11
(58) Field of Classification Search ............. 156/345.11, 156/345.18, 345.29, 345.37
See application file for complete search history.

(56) References Cited

U.S. PATENT DOCUMENTS

| | | | |
|---|---|---|---|
| 6,780,277 B2 * | 8/2004 | Yokomizo et al. | 156/345.11 |
| 2006/0042756 A1 * | 3/2006 | Miyazaki et al. | 156/345.18 |
| 2008/0087645 A1 * | 4/2008 | Izuta et al. | 216/93 |
| 2008/0099144 A1 * | 5/2008 | Change et al. | 156/345.11 |
| 2010/0122771 A1 * | 5/2010 | Chen et al. | 156/345.18 |

* cited by examiner

*Primary Examiner* — Sylvia R. MacArthur
(74) *Attorney, Agent, or Firm* — Rosenberg, Klein & Lee

(57) ABSTRACT

A chemical treatment apparatus includes an outer bath; an inner bath, located inside the outer bath; a circulation system, connecting the outer bath to the inner bath; and a draining system, having a first draining pipe and a connecting pipe, wherein the connecting pipe connects the first draining pipe to the circulation system. The suction force generated by a pump of the circulation system is thereby transferred to the first draining pipe. Therefore when the chemical solution is to be drained out from the inner bath, the draining of the chemical solution into the first draining pipe can be quickly done with the aid of the suction force.

20 Claims, 6 Drawing Sheets

CHEMICAL TREATMENT APPARATUS

BACKGROUND OF THE INVENTION

1. Field of the Invention

The invention generally relates to a chemical treatment apparatus, especially to a chemical treatment apparatus for wafer production.

2. Description of Related Art

In the semiconductor manufacture, a semiconductor device can be manufactured by multiple processing of wafers. Each processing step affects the yield and performance of the obtained semiconductor device, and therefore it is necessary to severely control the process parameters and operation conditions at each step, especially at etching step which aims at removing off specific sections of the wafer using a chemical solution to form a predetermined structure.

Etching includes two main categories: dry etching and wet etching. The wet etching is implemented by using a chemical apparatus which usually includes an outer bath, an inner bath and a circulation system. The inner bath is located inside the outer bath. The circulation system connects a bottom of the inner bath to a bottom of the outer bath.

The inner bath and the outer bath both contain the chemical solution. The chemical solution flows into the circulation system from the bottom of the outer bath, and then be pressurized by a pump in the circulation system to give the chemical solution energy. Thereafter the chemical solution is heated by a heater at a predetermined temperature, making sure that the etching rate reaches a predetermined value. The chemical solution then flows into the filter to remove out impurities therein. Finally, the chemical solution flows into the inner bath from bottom to top. The above outer bath, the inner bath, the pump, the heater, and the filter connect to each other by a pipe. Since the chemical solution continuously flows into the inner bath, the level of the chemical solution keeps going high. When the level of the chemical solution exceeds an upper edge of the inner bath, the chemical solution overflows into the outer bath. As such, the chemical solution keeps circulation within, in turns, the outer bath and the inner bath.

When the wafer is to be etched, a robot arm picks up at least one wafer from a wafer cassette and places it into the inner bath in a manner that the whole wafer is dipped inside the chemical solution. After a predetermined period of time, the robot arm removes from the inner bath, and the wafer has some sections removed therefore. The wafer material removal rate can be determined by the temperature and the flow speed of the chemical solution. The amount of wafer material removal can be calculated by multiplying the wafer material removal rate with the time of dipping the wafer into the chemical solution.

It is inevitable to have abnormal conditions during etching. If it is the robot arm out of order, then the wafer cannot be timely taken out of the inner bath, causing that the wafer is excessively etched and thus an unexpectable structure is formed. At abnormal conditions, many wafers cannot be used any more and the yield is consequently reduced.

Some approaches have been proposed to deal with such problems. For example, bottoms of the outer bath and the inner bath respectively add a drain valve which is closed when the etching process runs normally. When the robot arm is out of order and the wafer cannot be taken out of the inner bath, the valves are opened to drain out the chemical solution inside the outer and inner baths. Even the wafer stays inside the inner bath, the chemical solution still won't contact the wafer.

Theoretically, the faster the chemical solution drained out, the shorter the period of time the wafer contacts the chemical solution and thus the less the damage to the wafer. The higher percentage of the wafer could be used again based on such an assumption. In fact, the draining of the chemical solution according to the above approach is still not quick enough in terms of percentage of the wafer to be used again.

Consequently, because of the above limitation resulting from the technical design of prior art, the inventor strives via real world experience and academic research to develop the present invention, which can effectively improve the limitations described above.

SUMMARY OF THE INVENTION

It is an object of the invention to provide a chemical treatment apparatus which can drain out a chemical solution to avoid the wafer excessively etched when the wafer cannot be normally removed.

In order to achieve the above and other objectives, the invention provides a chemical treatment apparatus including an outer bath; an inner bath, located inside the outer bath; a circulation system, having a treatment module, a first transport pipe and a second transport pipe; and a draining system, having a first draining pipe, a second draining pipe and a connecting pipe.

The first transport pipe connects the outer bath to the treatment module. The second transport pipe connects the inner bath to the treatment module. The treatment module has a pump.

The first draining pipe connects to the inner bath, and the second draining pipe connects to the treatment module. The connecting pipe connects the first transport pipe to the first draining pipe.

The invention provides the following advantages over the prior art.

1. The first draining pipe connects to the circulation system via the connecting pipe so that the suction force generated by the pump can be transferred to the first draining pipe. Therefore, when the chemical solution is to be drained out from the inner bath, the chemical solution flows down from the inner bath because of the gravity force and is further sucked by the suction force.
2. Only one pump is used as a power source for the circulation system and the draining system in this invention. No additional pumps are needed for the draining system.

To provide a further understanding of the invention, the following detailed description illustrates embodiments and examples of the invention, this detailed description being provided only for illustration of the invention.

DETAILED DESCRIPTION OF THE PREFERRED EMBODIMENTS

Figure 1:
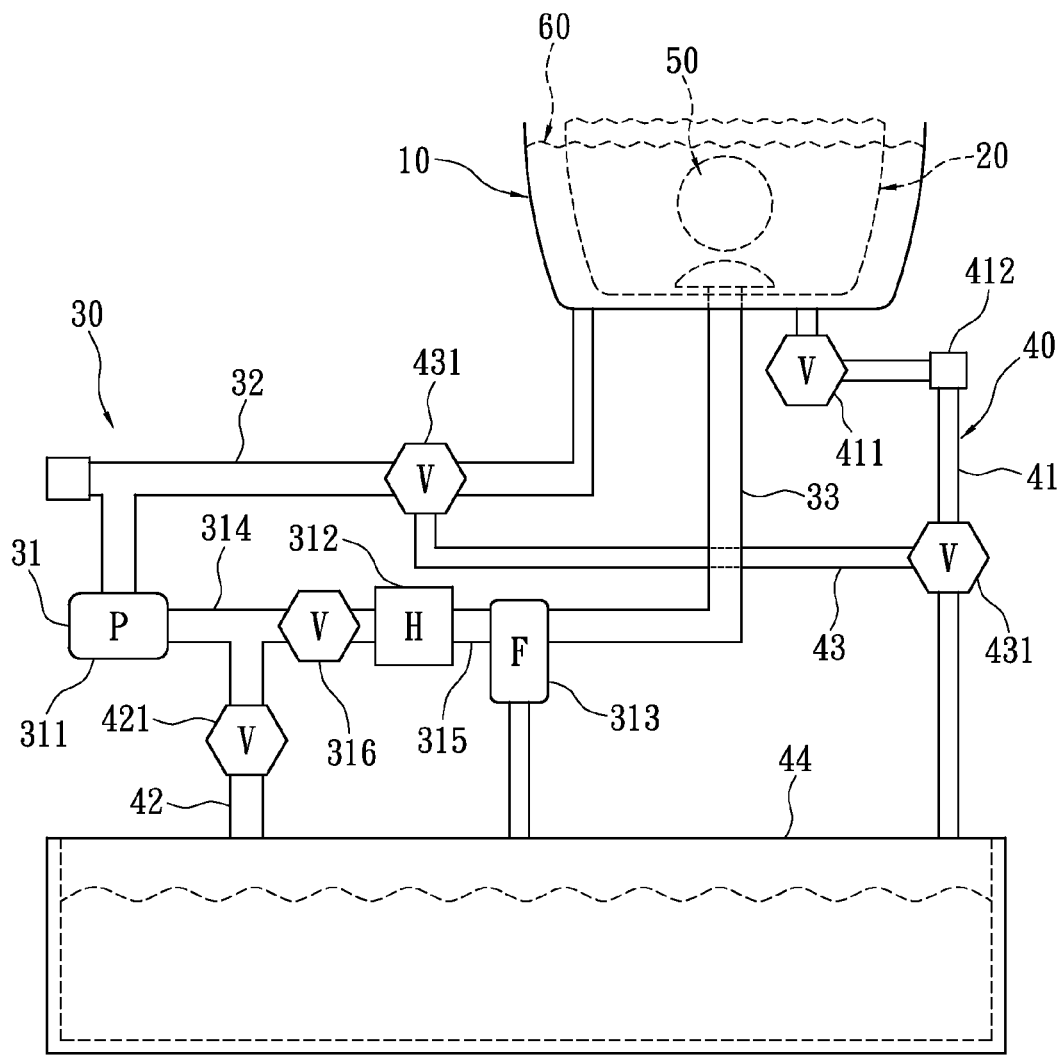
FIG. 1 is a schematic view of a chemical treatment apparatus according to a first embodiment of the invention.

Wherever possible in the following description, like reference numerals will refer to like elements and parts unless otherwise illustrated.

Referring to FIG. 1, a chemical treatment apparatus according to a first embodiment of the invention includes an outer bath 10, an inner bath 20, a circulation system 30, and a draining system 40. The chemical treatment apparatus is mainly used in an etching process for wafer production.

The inner bath 20 is located inside the outer bath 10, both of which respectively contain a chemical solution 60. The circulation system 30 connects the outer bath 10 to the inner bath 20. The chemical solution 60 of the outer bath 10 is conveyed into the inner bath 20 by the circulation system 30. The circulation system 30 has a treatment module 31, a first transport pipe 32 and a second transport pipe 33. The first transport pipe 32 has a first end connecting to a bottom of the outer bath 10, and a second end connecting to one end of the treatment module 31. The second transport pipe 33 has a first end connecting to a bottom of the inner bath 20, and a second end connecting to the other end of the treatment module 31, The treatment module 31 is used to add pressure and heat to the chemical solution 60, and therefore has a pump 311, a heater 312, a filer 313, two intermediate transport pipes 314, 315, and a main control valve 316. The pump 311 has one end connecting to the first transport pipe 32 and the other end connecting to one end of the intermediate transport pipe 314. The other end of the intermediate transport pipe 314 connects to one end of the heater 312. The other end of the heater 312 connects to one end of the intermediate transport pipe 315. The other end of the intermediate transport pipe 315 connects to one end of the filter 313. The other end of the filter 313 connects to one end of the second transport pipe 33. An intermediate section between the two ends of the intermediate transport pipe 314 has the main control valve 316 which controls the solution to flow through the pipes. The main control vale 316 is kept open at normal condition.

The draining system 40 connects the inner bath 20 to the circulation system 30 so as to drain the chemical solutions 60 out of the outer bath 10 and the inner bath 20. The draining system 40 has a first draining pipe 41, a second draining pipe 42, a connecting pipe 43 and a storage container 44. The first draining pipe 41 has a first end connecting to the bottom of the inner bath 20, and a second end connecting to the storage container 44. The first draining pipe 41 has a first draining pipe control valve 412 and a level sensor 412 between two ends of the first draining pipe 41. The first draining pipe control valve 412 is located at an upstream of the level sensor 412 in terms of the flowing direction of the chemical solution 60. The upstream of the level sensor 412 is defined as a location where the chemical solution 60 flows earliest among other parts of the level sensor 412. The first draining pipe control valve 412 normally is closed, so that the chemical solution 60 cannot pass through the first draining pipe control valve 412. The level sensor 412 detects the flow or the level of the chemical solution 60 while the chemical solution 60 is flowing through the first draining pipe 41.

The second draining pipe 42 has one end connecting to the treatment module 31, specifically, to the pump 311 or the heater 312. In this embodiment, the second draining pipe 42 connects to the pump 311. The second draining pipe 42 is located at an upstream of the main control valve 316. The other end of the second draining pipe 42 connects to the storage container 44. The second draining pipe 42 has a second draining pipe control valve 421 between the two ends of the second draining pipe 42. The second draining pipe control valve 421 is normally closed.

The connecting pipe 43 has one end connecting to the first transport pipe 32 and the other end connecting to intermediate sections of the first draining pipe 41. The connecting pipe 43 is located at a downstream of the level sensor 412, and further has at least one connecting pipe control valve 431. In this embodiment, two connecting pipe control valves 431 are used and respectively located at opposite ends of the connecting pipe 43. The connecting pipe control valves 431 are normally closed. The storage container 44 is used to receive the chemical solution 60.

Figure 2:
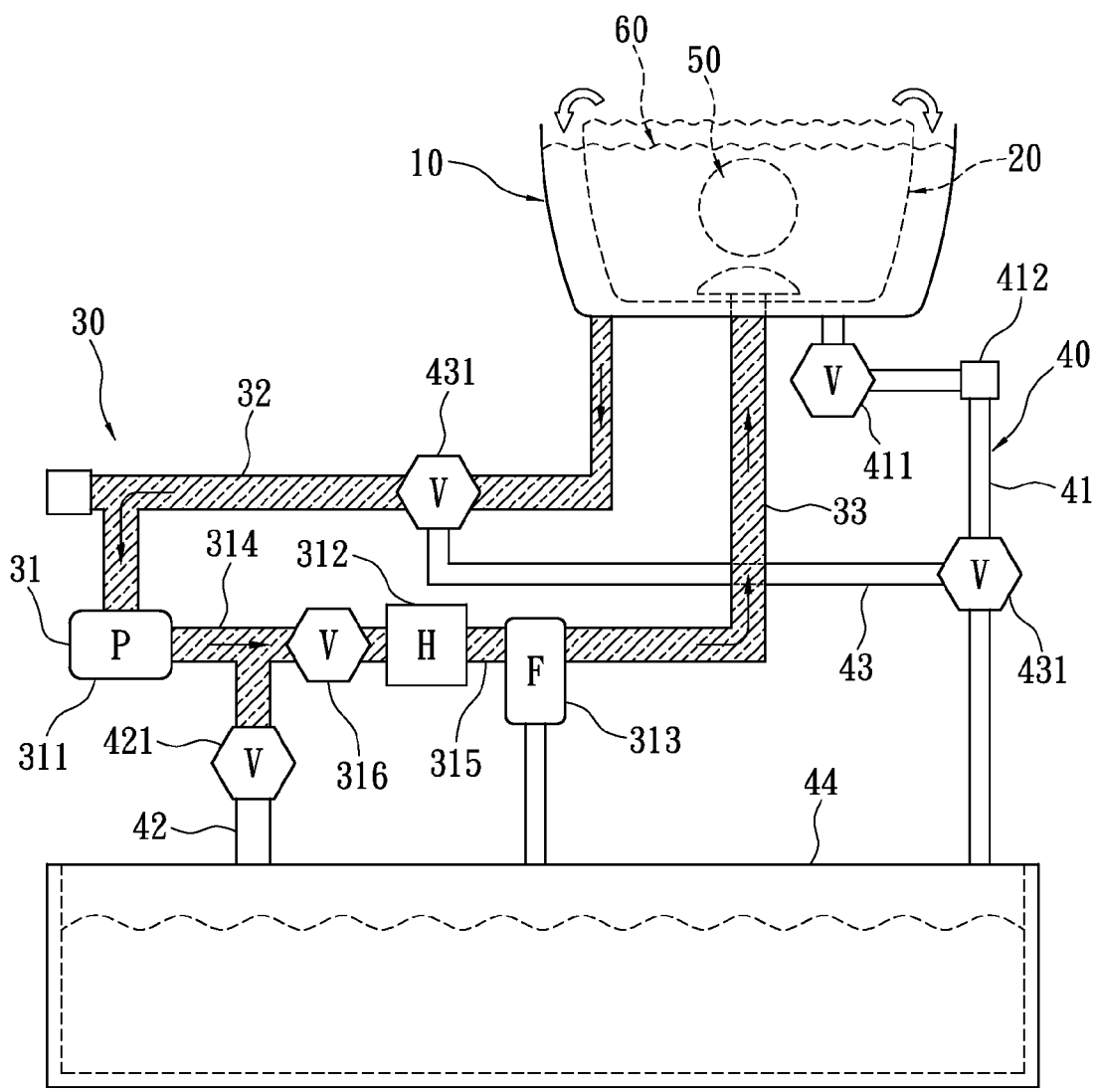
FIG. 2 is a schematic view of circulation of a chemical solution in a chemical treatment apparatus according to a first embodiment of the invention.

Referring to FIG. 2, when a wafer 50 is to be etched, a robot arm, not shown, picks the wafer 50 to dip into the chemical solution 60 inside the inner bath 20. After a predetermined period of time, the robot arm removes the etched wafer 50 from the inner bath 20. Some parts of the etched wafer 50 have been removed already to form a predictable structure.

During the etching process, the control valves 411, 421, 431 of the draining system 40 are closed while the pump 311 of the treatment module 31 keeps running to form a suction force by which the chemical solution 60 in the outer bath 10 is sucked into the first transport pipe 32. With the aid of the gravity force, the chemical solution 60 automatically flows into the first transport pipe 32. The chemical solution 60 then flows into the pump 311 to be pressurized so that the chemical solution 60 gains energy. Thereafter, the chemical solution 60 flows into the heater 312 to be heated at a predetermined temperature, and then flows into the filter 313 to filer out the impurities in the chemical solution 60. Finally, the chemical solution 60 flows into the second transport pipe 33 and then in the inner bath 20 through the bottom of the inner bath.

Since the chemical solution 60 continuously flows into the inner bath 20, the level of the chemical solution keep going high. When the level of the chemical solution 60 exceeds an upper edge of the inner bath 20, the chemical solution 60 overflows into the outer bath 10. As such, the chemical solution 60 keeps circulating within, in turns, the outer bath 10, the circulation system 30 and the inner bath 20.

Figure 3:
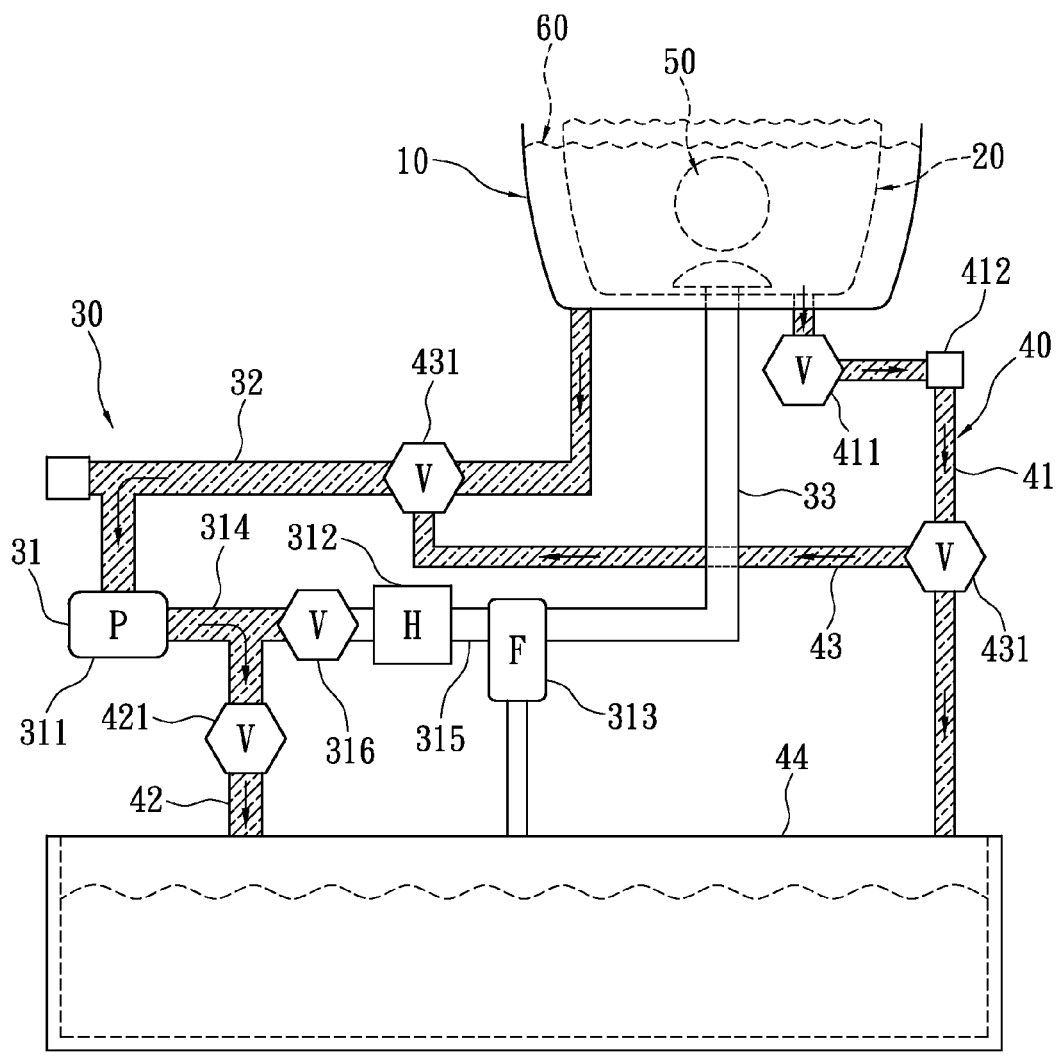
FIG. 3 is a schematic view of removal of a chemical solution in a chemical treatment apparatus according to a first embodiment of the invention.

Referring to FIG. 3, if the robot arm is out of order and therefore cannot remove the wafer 50 timely from the inner bath 20, the draining system 40 will immediately work. First, the control valves 411, 421, 431 are triggered to open while the main control valve 316 of the circulation system 30 will be closed instead. The pump 311 keeps running at this moment. The chemical solution 60 of the outer bath 10 will be sucked into the first transport pipe 32, and then flows into the pump 311 to be pressurized. However, the chemical solution 60 will not further flow into the heater 312, but into the storage container 44 through the second draining pipe 42.

Furthermore, the suction force generated by the pump 311 can be transferred to the first draining pipe 41 via the connecting pipe 43. Thereby, the chemical solution 60 in the inner bath 20 can be quickly sucked into the first draining pipe 41. Part of chemical solution 60 can go to the end of the first draining pipe 41 and then into the storage container 44. Another part of the chemical solution 60 is sucked into the connecting pipe 43 and then in turns into the first transport pipe 32 and the pump 311, and finally into the storage container 44 via the second draining pipe 42. When the chemical solution 60 of the inner bath 20 is totally drained out to the storage container 44, the level sensor 412 of the first draining pipe 41 detects no chemical solution 60 flowing therein. At this moment, the level sensor 412 emits a control signal to stop the pump 311 working, avoiding the pump 311 from becoming idled. The control signal further warns a maintenance engineer to deal with the problem of the malfunctioning robot arm.

In this invention, the gravity and the suction force of the pump 311 work together to efficiently drain the chemical solution 60 of the inner bath 20 out, and therefore the draining of the chemical solution 60 can be done more quickly.

Figure 4:
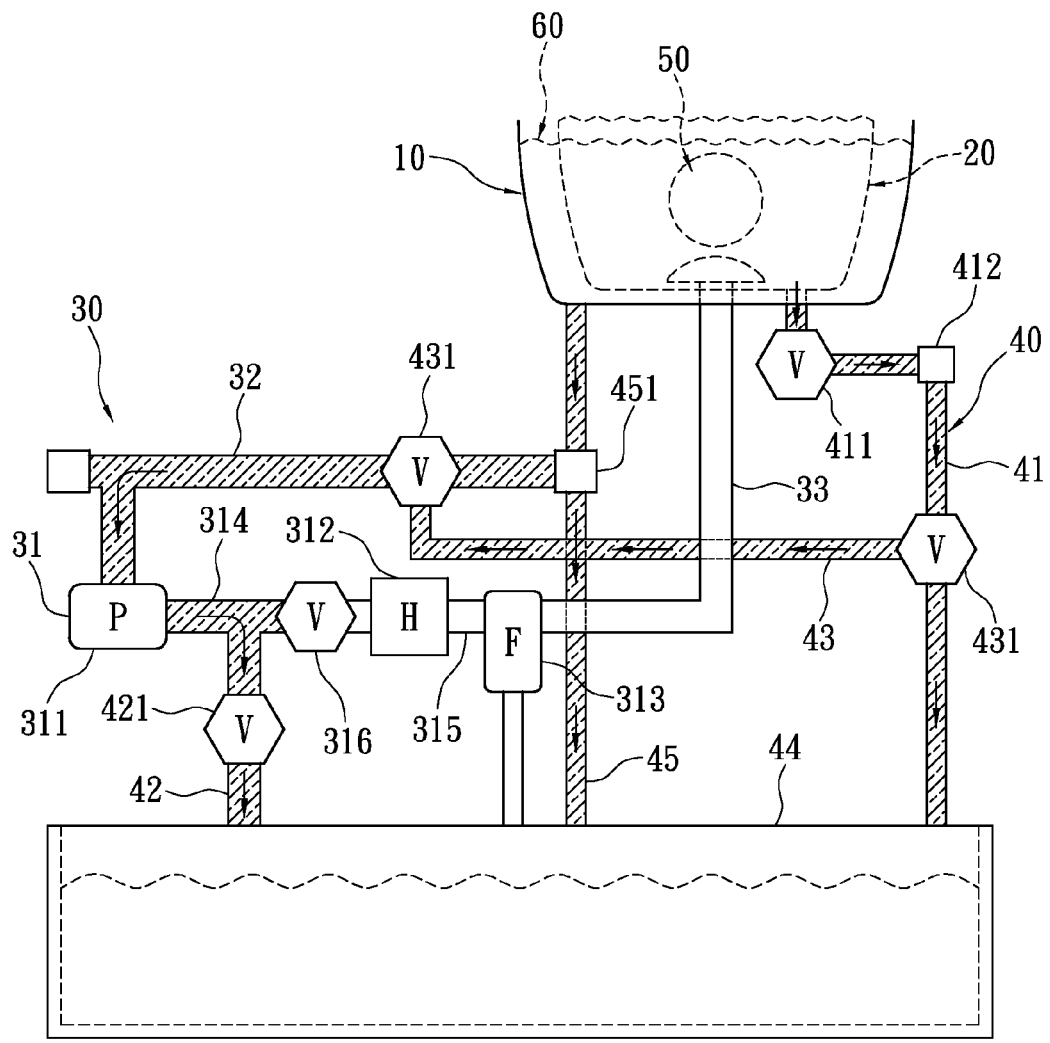
FIG. 4 is a schematic view of removal of a chemical solution in a chemical treatment apparatus according to a second embodiment of the invention.

Referring to FIG. 4, which represents a second embodiment of the invention. The second embodiment is the same as the first embodiment, except that the draining system 40 has a third draining pipe 45 which has a first end connecting to the intermediate sections of the first transport pipe 32 and a second end connecting to the storage container 44. The intersection of the third draining pipe 45 and the first transport pipe 32 is located at an upperstream of the intersection of the connecting pipe 43 and the first transport pipe 32. The third draining pipe 45 has a third draining pipe control valve 451 which is normally closed.

When the robot arm is out of order, the control valve 451 will be opened so that the chemical solution 60 of the outer bath 10 and the second bath 20 flows into the storage container 44, in addition to via the first draining pipe 41 and the second draining pipe 42, further via the third draining pipe 45. Therefore, compared to the above embodiment, the third draining pipe 45 in the second embodiment assists to speed up the draining of the chemical solution 60 of the outer bath 10 and the inner bath 20.

Figure 5:
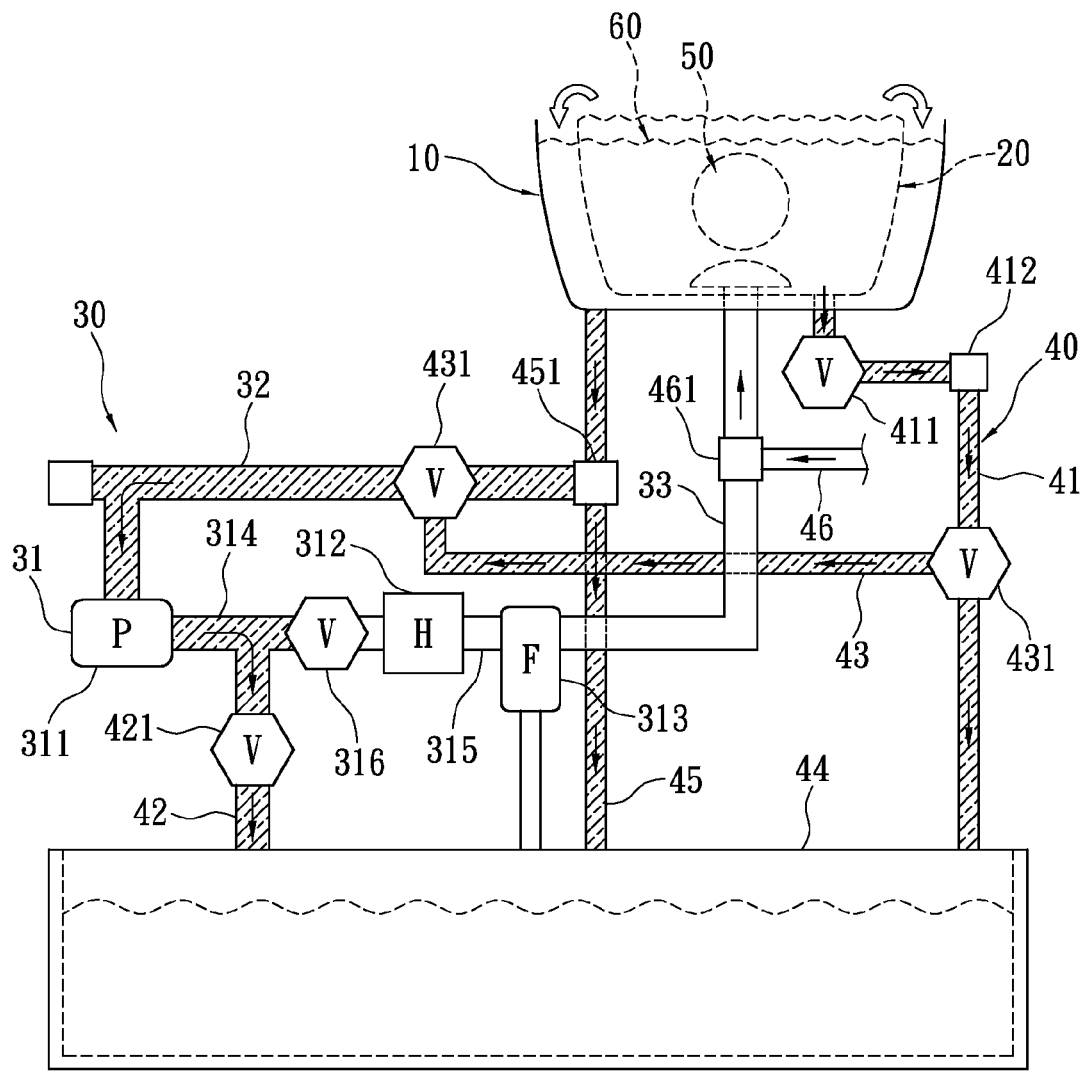
FIG. 5 is a schematic view of removal of a chemical solution in a chemical treatment apparatus according to a third embodiment of the invention.

Referring to FIG. 5, which represents a third embodiment of the invention. The third embodiment is the same as the second embodiment, except that the draining system 40 has a water transport pipe 46 which has a first end connecting to the intermediate sections of the second transport pipe 32. The water transport pipe 46 further has a water transport pipe control valve 461 which is normally closed. When the robot arm is out of order, the control valve 461 will be opened to input great amount of pure water, not shown, into the water transport pipe 46. The pure water will be led to the second transport pipe 33 and then into the inner bath 20 to dilute the chemical solution 60 in the inner bath 20 and therefore reduce the material removal rate from the wafer 50. Meanwhile, the chemical solution 60 of the inner bath 20 will be quickly drained to the storage container 44 via the first draining pipe 41 and the second draining pipe 42.

Figure 6:
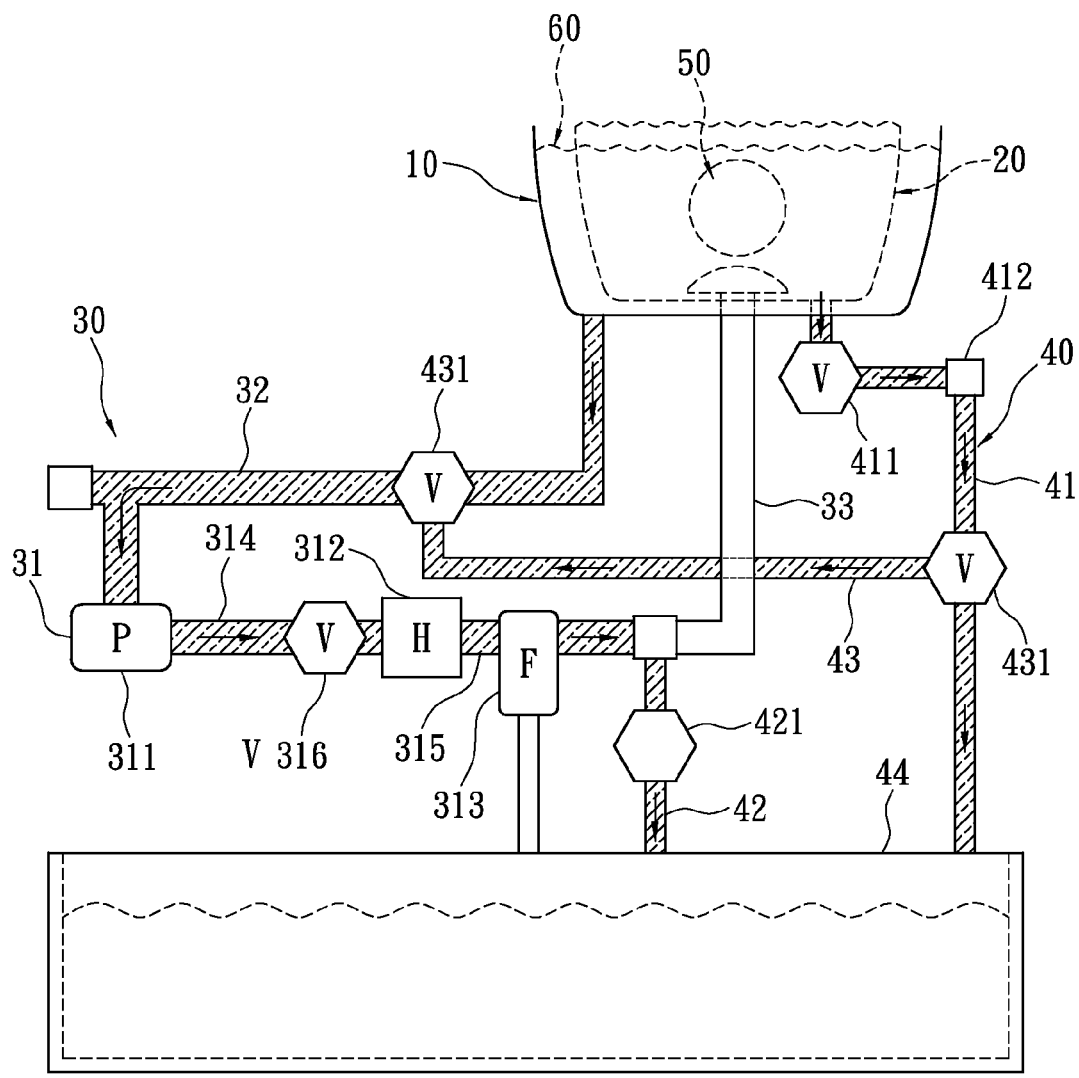
FIG. 6 is a schematic view of removal of a chemical solution in a chemical treatment apparatus according to a fourth embodiment of the invention.

Referring to FIG. 6, which represents a fourth embodiment of the invention. The fourth embodiment is the same as the first embodiment, except that the second draining pipe 42 has a first end connecting to the intermediate sections of the second transport pipe 33 and a second end connecting to the storage container 44. The fourth embodiment has the comparable performance to the first embodiment in terms of removal of the chemical solution 60.

In light of the above, the invention provides the following advantages over the prior art. Only one pump 311 is used as a power source for the circulation system 30 and the draining system 40. No additional pumps are needed for the draining system 49 compared to the prior art.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A chemical treatment apparatus comprising
    an inner bath (20) having an intake port and a discharge port;
    an outer bath (10) having a discharge port, configured to receive overflowing liquid from the inner bath (20);
    a circulation system (30), including
        a treatment module (31) having a pump (311),
        a first transport pipe (32) connecting the discharge port of the outer bath (10) and the pump (311) of the treatment module (31), and
        a second transport pipe (33) connecting the intake port of the inner bath (20) and the pump of the treatment module (31); and
    a draining system (40), having
        a first draining pipe (41) in connection with the discharge port of the inner bath (20),
        a second draining pipe in connection with the treatment module (31), and
        a connecting pipe (43) connecting the first transport pipe (32) and the first draining pipe (41);
    wherein the first and the second transport pipes selectively establish a circulation path,
    wherein the first transport pipe and the connection pipe selectively establish a discharge path with the first and the second draining pipes;
    wherein both the circulation and the discharge paths are pressurizable by the pump of the treatment module.

2. The chemical treatment apparatus of claim 1, wherein the connecting pipe has at least one connecting pipe control valve.

3. The chemical treatment apparatus of claim 1, wherein the first draining pipe has a first draining pipe control valve and the second draining pipe has a second draining pipe control valve.

4. The chemical treatment apparatus of claim 1, wherein the treatment module has a main control valve.

5. The chemical treatment apparatus of claim 1, wherein the draining system further has a storage container, wherein the second draining pipe has a second end connecting to the storage container and the first draining pipe has a second end connecting to the storage container.

6. The chemical treatment apparatus of claim 5, wherein the draining system has a third draining pipe connecting the first transport pipe to the storage container.

7. The chemical treatment apparatus of claim 6, wherein the third draining pipe further has a third draining pipe control valve.

8. The chemical treatment apparatus of claim 1, wherein the pump has a first end connecting to the first transport pipe and a second end connecting to the second draining pipe.

9. The chemical treatment apparatus of claim 8, wherein the treatment module has a heater and a first intermediate transport pipe, the first intermediate transport pipe connecting the heater to the pump.

10. The chemical treatment apparatus of claim 9, wherein the intermediate transport pipe has a control valve.

11. The chemical treatment apparatus of claim 9, wherein the treatment module has a filter and a second intermediate transport pipe, the second intermediate transport pipe connecting the heater to the filter, the filter further connects to the second transport pipe.

12. The chemical treatment apparatus of claim 1, wherein the first draining pipe further has a level sensor.

13. The chemical treatment apparatus of claim 1, wherein the draining system further has a water transport pipe connecting to the second transport pipe.

14. A chemical treatment apparatus comprising
an inner bath having an intake port and a discharge port;
an outer bath having a discharge port, configured to receive overflowing liquid from the inner bath;
a circulation system, including
   a treatment module having a pump,
   a first transport pipe connecting the discharge port of the outer bath and the pump of the treatment module,
   a second transport pipe connecting the intake port of the inner bath and the pump of the treatment module; and
a draining system, having
   a first draining pipe in connection with the discharge port of the inner bath,
   a second draining pipe in connection with the second transport pipe, and
   a connecting pipe connecting the first transport pipe and the first draining pipe;
wherein the first and the second transport pipes selectively establish a circulation path,
wherein the first transport pipe and the connection pipe selectively establish a discharge path with the first and the second draining pipes;
wherein both the circulation and the discharge paths are pressurizable by the pump of the treatment module.

15. The chemical treatment apparatus of claim 14, wherein the connecting pipe has at least one connecting pipe control valve.

16. The chemical treatment apparatus of claim 14, wherein the first draining pipe has a first draining pipe control valve and the second draining pipe has a second draining pipe control valve.

17. The chemical treatment apparatus of claim 14, wherein the treatment module has a main control valve.

18. The chemical treatment apparatus of claim 14, wherein the draining system further has a storage container, wherein the second draining pipe has a second end connecting to the storage container and the first draining pipe has a second end connecting to the storage container.

19. A chemical treatment apparatus comprising
an inner bath (20) having an intake port and a discharge port;
an outer bath (10) having a discharge port, configured to receive overflowing liquid from the inner bath (20);
a circulation system (30), including
   a treatment module (31) having a pump (311),
   a first transport pipe (32) connecting the discharge port of the outer bath (10) and the pump (311) of the treatment module (31), and
   a second transport pipe (33) connecting the intake port of the inner bath (20) and the pump of the treatment module (31); and
a draining system (40), having
   a first draining pipe (41) in connection with the discharge port of the inner bath (20),
   a second draining pipe arranged between the first and the second transport pipes, and
   a connecting pipe (43) connecting the first transport pipe (32) and the first draining pipe (41);
wherein the first and the second transport pipes selectively establish a circulation path,
wherein the first transport pipe and the connection pipe selectively establish a discharge path with the first and the second draining pipes;
wherein both the circulation and the discharge paths are pressurizable by the pump of the treatment module.

20. The chemical treatment apparatus of claim 19, wherein the intake port of the inner bath is used as the discharge port, and wherein the circulating path and the discharge path through the intake port of the inner bath is selectively controlled by a control valve (411).

* * * * *